United States Patent [19]

Chikamura et al.

[11] 4,271,420
[45] Jun. 2, 1981

[54] SOLID-STATE IMAGE PICKUP DEVICE

[75] Inventors: Takao Chikamura, Osaka; Kazufumi Ogawa, Neyagawa; Yasuaki Terui, Neyagawa; Shinji Fujiwara, Neyagawa; Masakazu Fukai, Nishinomiya, all of Japan

[73] Assignee: Matsushita Electric Industrial Co., Ltd., Osaka, Japan

[21] Appl. No.: 119,187

[22] Filed: Feb. 6, 1980

[30] Foreign Application Priority Data

Feb. 13, 1979 [JP] Japan .................................. 54-15746

[51] Int. Cl.³ .................... H01L 27/14; H01L 29/78
[52] U.S. Cl. ...................................... 357/30; 357/24; 357/41; 307/311
[58] Field of Search ........................... 357/30, 24, 41; 307/311

[56] References Cited

U.S. PATENT DOCUMENTS

| 4,176,369 | 11/1979 | Nelson | 357/24 |
| 4,197,469 | 4/1980 | Cheung | 307/22 LD |
| 4,200,892 | 4/1980 | Weimer | 358/213 |
| 4,210,922 | 7/1980 | Shannon | 357/24 |

Primary Examiner—Martin H. Edlow
Attorney, Agent, or Firm—Burgess, Ryan and Wayne

[57] ABSTRACT

In a solid-state image pickup device of the type in which a photosensitive or photoconductive film is formed over a substrate capable of charge-transfer or X-Y address scanning and an electrode is formed over the photosensitive or photoconductive film, a means for applying to the electrode a voltage having an amplitude proportional to the amount of incident light, whereby blooming may be minimized and an automatic aperture control function may be attained. Because the voltage applied to the electrode over the photosensitive or photoconductive film is set so that the sensitivity of the photoconductive film may be decreased when a light image of high intensity falls on the device, blooming may be avoided.

2 Claims, 13 Drawing Figures

SOLID-STATE IMAGE PICKUP DEVICE

BACKGROUND OF THE INVENTION

The present invention relates to a solid-state image pickup device, and more particularly a solid-state image pickup device of the type wherein a photosensitive or photoconductive layer is formed over a solid-state image pickup plate having circuit elements capable of charge transfer or having the X-Y addressing capability. The present invention has for its object to provide a solid-state image pickup device which may avoid blooming when the intensity of the incident light is high and which has an automatic electrically operated aperture control function.

Japanese Patent Publication No. 30768/1970 discloses the so-called X-Y addressing type solid-state image pickup device wherein a matrix of photosensors or photodiodes is combined with a field-effect transistor circuit which scans the matrix in both X and Y directions. Japanese Laid-Open Pat. Nos. 1221/1971 and 26091/1972 disclosed BBD (bucket brigade device) and CCD (charge-coupled device or charge transfer device) which are of the self-scanning type and capable of minimizing the spike noise generated together with the scanning pulses. Both the matrix of photosensors or photodiodes and the field-effect transistor circuit or an array of charge transfer elements must be formed on the same substrate so that the occupancy of the optical aperture per unit area is $\frac{1}{3}$ to 1/5 at the most.

In order to improve the occupancy of the optical aperture, Japanese Laid-Open Pat. No. 91116/1974 teaches a solid-state image pickup device in which instead of photodiodes a photoconductive element is used as a photosensor and combined with an X-Y addressing means. Japanese Laid-Open Pat. No. 21166/1975 also discloses the combination of the above-described sensitive photoelectric element with the array of charge transfer elements. In either case, the electrode over the photosensitive or photoconductive film is maintained at the same potential as the semiconductor substrate or grounded.

In above condition, the sensitivity of the photosensitive or photoconductive film is constant in any circumstances of the incident light, so blooming occurs in high-light condition and automatic optical aperture control lenses must be used to avoid blooming, but such lenses are usually expensive and heavy.

SUMMARY OF THE INVENTION

The present invention has, therefore, its object to provide a solid-state image pickup device of the type described which includes a means for applying to an electrode over a photosensitive or photoelectric film a voltage in proportion to the amount of incident light so that not only blooming may be avoided but also the photosensitivity may be electrically controlled by utilizing the phenomenon that the sensitivity varies in response to the voltage applied to said electrode.

According to one aspect of the present invention, a DC or pulse voltage in proportion to the amount of incident light is applied to an electrode formed over a photoelectric film. As a result, a light image of a predetermined intensity may be always picked up. In addition, even when a spot light is locally incident on the photoelectric film, the overall sensitivity may be decreased so that blooming may be minimized. Moreover, it may be realized only with electric and electronic elements, so that the solid-state image pickup devices may be provided which are very simple in construction, compact in size and inexpensive to manufacture.

The above and other objects, effects and features of the present invention will become more apparent from the following description of some preferred embodiments thereof taken in conjunction with the accompanying drawings.

DESCRIPTION OF THE PREFERRED EMBODIMENTS

Figure 1:
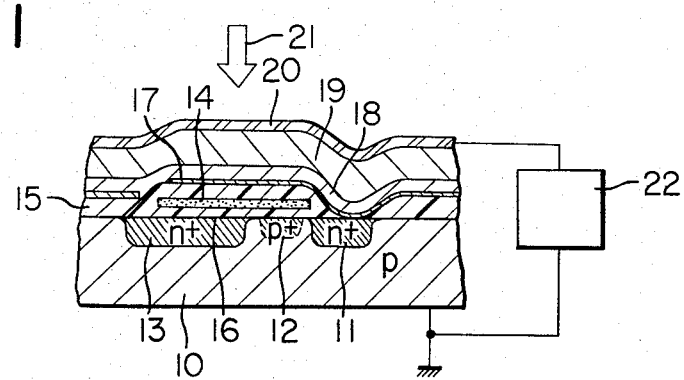
FIG. 1 is a sectional view of a unit cell of a charge-transfer or charge-coupled type solid-state image pickup device in accordance with the present invention.

FIG. 1 is a cross sectional view of a unit cell charge transfer device formed on a silicon substrate of a solid-state image pickup device. Within the bulk of a p-type semicionductor substrate 10 is formed an n+-type region 11, whereby a diode is formed. The numeral 12 is a p+-type region and is a potential barrier for preventing the injection of charge from the n+ region 11 in the case of the charge-coupled device. The numeral 13 is an n+-type region and serves as a potential well in the case of BBD. The region 12 or 13 is formed in the case of CCD or BBD respectively. Both CCD and BBD are fundamentally same charge transfer devices so that the present invention will be described in conjunction with BBD having the n+-type drain region 13. The numeral 14 is a first gate electrode partly overlapping the n+-type region 11. The numeral 16 is a gate insulating oxide film for electrically separating the substrate 10 and the first gate electrode 14. The numeral 15 is an insulating layer for electrically isolating the substrate 10, the first gate electrode 14 and a first electrode 17. The first electrode 17 is connected electrically to the n+-type region 11 and is an electrode of a n type semiconductor layer 18. The numeral 19 is a photoconductive layer consisting of $(Zn_{1-x}Cd_xTe)_{1-y}(In_2Te_3)_y$ and is coated with a transparent electrode 20 upon which the incident light 21 impinges. The photoconductive layer made of 18 and 19 is not limited to the compound described above and may be formed of any material which mainly consists of amorphous silicon (Si) or selenium (Se) and has the capability of generating electrons and holes in a quantity proportional to the amount of incident light. The numeral 22 is a means which features the present invention and includes a means for resulting the signal proportional to the photocurrent, a means for transforming the signal to the voltage and a means for applying this voltage, to the second electrode 20.

Figure 2A:
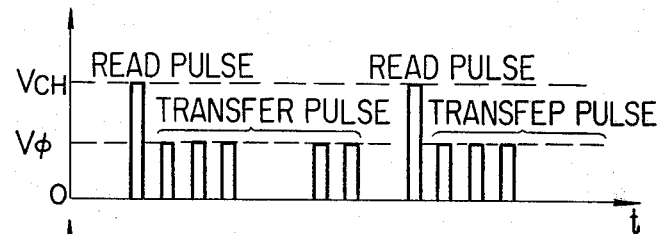
FIGS. 2A and 2B are views used for the explanation of the mode of operation thereof.
Figure 2B:
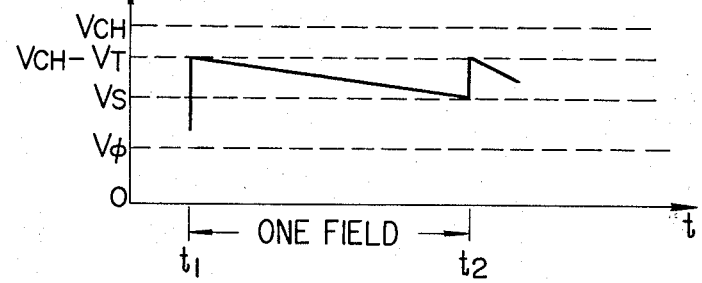

Next, the mode of reading the signal of the unit cell with the construction shown in FIG. 1 will be described. FIGS. 2A and 2B show the patterns of pulses which drive the unit cell and the variation in potential at the first electrode 17. At $t_1$, a read pulse $V_{CH}$ is applied to the first gate electrode 14 so that the potential at the electrode 17 rises to $(V_{CH}-V_T)$ as shown in FIG. 2B. $V_{CH}$ is the voltage of read pulse and $V_T$ is a threshold voltage of an FET consisting of the n+-type regions 11 and 13 and the first gate electrode 14. In response to the incident light 21, electron-hole pairs are generated in the photoconductive layer 19 and electrons are attracted toward the electrode 17 while holes, towards the electrode 20, whereby the potential at the electrode 17 drops. This potential drop is proportional to the amount of incident light. Since the storage or integration time lasts for one field time, the potential drops to $V_s$. At $t_2$, $V_{CH}$ is applied to the first gate electrode 14 so that the potential of the first electrode 17 rises. As a result, the transfer of electrons from the n+-type region 11 to the region 13 results so that the potential at the region 11 rises again to $(V_{CH}-V_T)$. Thus, the total amount of charge transferred into the region 13 is proportional to the amount of incident light 21.

Figure 3:
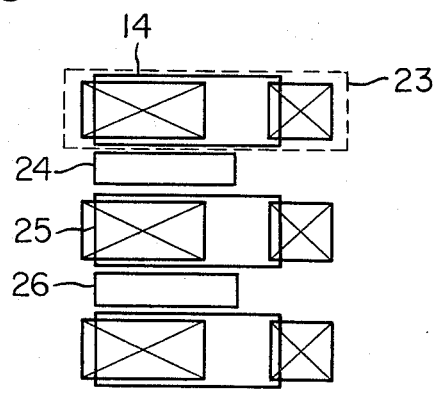
FIG. 3 is a schematic top view thereof.

Next will be described a means for transferring the signal stored into the n+-type region 13 toward an output terminal. FIG. 3 shows a one-dimensional unit cells of the type shown in FIG. 1. Each unit cell is indicated by a region surrounded by the dotted lines 23, and other reference numerals correspond to those used in FIG. 1. Second gate electrodes 24 and 26 are additionally formed between the first gate electrodes 14 and 25 of the adjacent unit cells. The amount of charge which has been read by the first gate electrode 14 through the steps described above, is transferred into the region immediately below the second gate electrode 24 when the positive transfer pulse $V_\phi$ (See FIG. 2A) is applied thereto. In like manner, the charge is transferred to the regions below the first and second gate electrodes 25 and 26 in the manner described above and finally to the output terminal. Thus, the optical signal is converted by the photosensor element into the electrical signal and transferred to the output terminal by the two-phase clock pulse.

Next, the process for fabricating the solid image pickup device of the type described above with particular reference to FIGS. 1-3 will be described. First, the n+-type regions 11 and 13 are formed by the diffusion process within the bulk of the p-type silicon substrate 10. Thereafter, the oxide film 16 is formed over the whole surface by the thermal oxidation and thereafter, the first gate electrode 14 is formed with the use of polysilicon. Next, the oxide film 16 is so etched as to open a contact window to the region 11. Thereafter, the insulating film 15 is formed with glass such as Phospho-Silicate glass having a relatively low melting point and is subjected to the heat treatment so that the surface of the insulating film 15 may be smoothed as a result of the melt flow of the glass. Next, the electrode 17 consisting of Mo, Ta and so on is formed which is brought into contact with the region 11 through the contact window. Thereafter, the n type semiconductor layer 18 is formed by the vacuum evaporation process with ZnO, ZnS, ZnSe, CdS, CdSe or the like and then the photosensitive layer 19 is formed by the vacuum evaporation process with $(Zn_{1-x}Cd_xTe)_{1-y}(In_2Te_3)_y$ to a thickness of from 0.8 to 2.5 microns. Thus, the fabricated heterojunction is subjected to a heat treatment in vacuum for from five to 30 minutes at from 300° to 600° C. Thereafter, the transparent electrode 20 consisting of $In_2O_3$ or $SnO_2$ is formed to a thickness of from 0.1 to 0.5 microns by the sputtering process. Thus, the solid image pickup device of the present invention is obtained.

Next, the means for deriving the signal which is proportional to the photocurrent and the means for applying this voltage signal to the second electrode 20, both of which are most important features of the present invention, will be described below.

Figure 4:
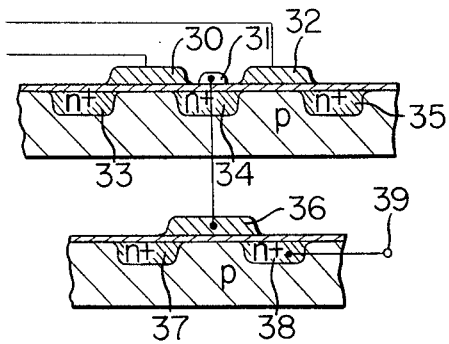
FIG. 4 is a sectional view of a floating gate type output deriving system.
Figure 5:
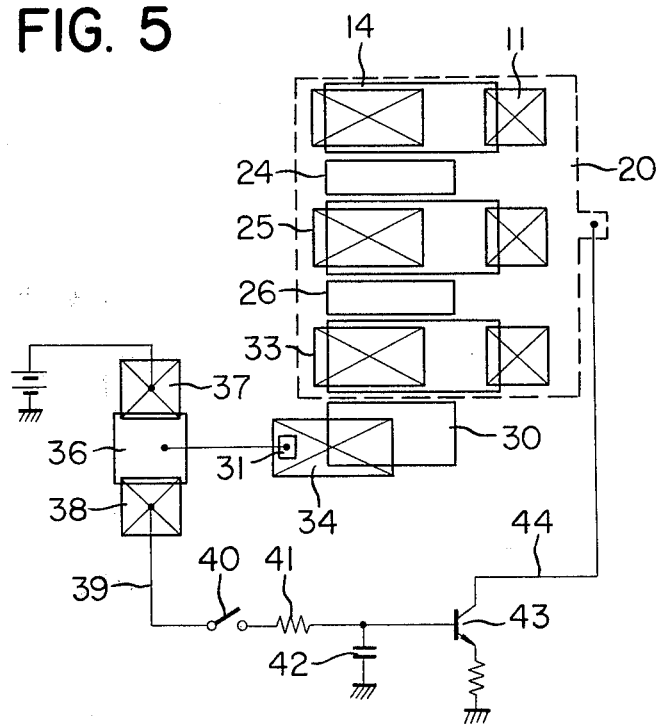
FIG. 5 is a schematic top view thereof.

Various means may be employed for deriving the signal and as one example, the floating gate system will be described. The system is shown in FIG. 4 and the whole system is shown in FIG. 5. The numerals 33, 34, 35, 37 and 38 are the n+-type regions formed within the bulk of the p-type substrate and the numerals 30, 32 and 36 are gate electrodes. The numeral 31 is a floating gate electrically connected to the gate electrode 36. When the gate pulse is applied to the gate electrode 30, the charge, which is corresponding to the incident light and has been transferred to the region 33, is transferred into the region 34. Then, the potential at the region 34 changes and this voltage change is detected as the voltage change at the floating electrode 31 and is transmitted to the gate electrode 36. With the region 37 as a source and the region 38 as a drain, the voltage change at the gate electrode 36 is amplified and derived from the terminal 39. As is clear from the above description, the floating gate type signal deriving system is nondestructive and highly sensitive and may be realized on one-chip. Instead of the floating gate system, any other suitable system may be employed. For instance, a photodiode may be formed within the bulk of the semiconductor substrate and the output signal of the photodiode may be used.

Next, the means for converting the output signal derived in the manner described above into a DC voltage to be applied to the second electrode 20 will be described. Various schemes may be used for converting the output signal into the DC voltage. For instance, the signals are integrated over the one field time so that the voltage signal representative of the mean signal may be derived. Alternatively, the local signals whose addresses are specified may be used because the signals read out from the solid image pickup device are time-serial.

Figure 6:
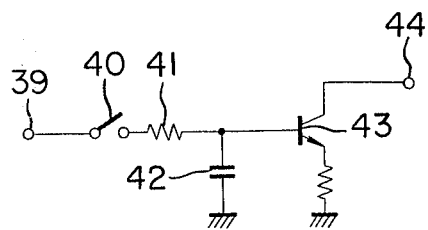
FIGS. 6 and 7 are diagrams, respectively, of a circuit for converting the output signal pulse into a DC voltage which in turn is applied to a second electrode.

FIG. 6 is a diagram of a circuit which averages the signal by the integration of the signal during a time of one field and applies the averaged signal to the second electrode 20. The overall construction is shown in FIG. 5. A switch 40 is synchronized with the vertical synchronous signal. The pulse signal, which is derived by the floating gate system described above in conjunction with FIG. 4, is applied to an input terminal 39 and is converted into the signal including a DC component through a low-pass filter consisting of a resistor 41 and a capacitor 42. The signal is then amplified by a transistor 43 and derived from an output terminal 44 so as to be applied to the second electrode 20. When the time constant of the low-pass filter consisting of the resistor 41 and the capacitor 42 is determined to be greater than the time 1/60 sec. of one field, it becomes possible to average the signals from the whole image area.

Figure 7:
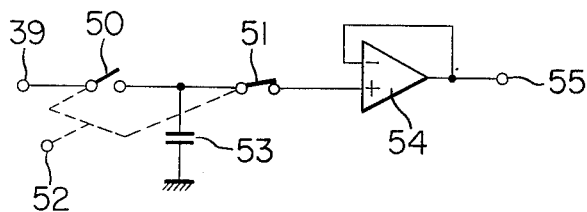

Next, the system for deriving the signal to be applied to the second electrode 20 by the local signal whose address is specified will be described. This system may be effected by the use of a sample-and-hold circuit as shown in FIG. 7. The numeral 52 is used for inputing the pulse which designates an address. The numerals 50 and 51 are switches which are so arranged that when the switch 50 is turned on, the switch 51 is turned off and vice versa. The numeral 53 is a capacitor, and the numeral 54 is an operational amplifier having a high input impedance. The time constant, which is dependent upon the product of the value of the input impedance at the terminal 39 and the value of the capacitor 53, is selected smaller than the width of the input pulse applied to the terminal 39. In addition, the time constant, which is dependent upon the product of the value of the input impedance of the operational amplifier 54 and the value of the capacitor 53, must be selected sufficiently greater than the width of the input pulse. With this circuit, the voltage which is in proportion to that of the input pulse voltage is applied to the terminal 39 and includes a DC voltage which is derived from the terminal 55 and is converted into the DC voltage which in turn is applied to the second electrode 20. The circuit for converting the output voltage into the DC voltage may be formed on the same tip as the circuit shown in FIG. 7 or may be formed separately.

Figure 8:
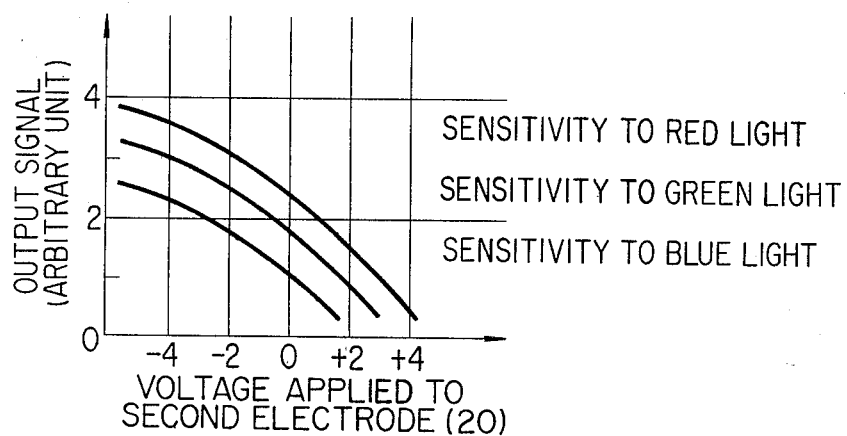
FIG. 8 is a graph showing the dependence of the output signal upon the voltage of the second electrode.
Figure 9:
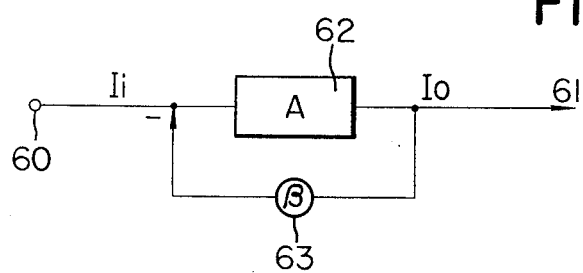
FIG. 9 is a diagram of a feedback circuit.

FIG. 8 shows the dependence of the output signal on the voltage applied to the second electrode 20 in the solid image pickup device in accordance with the present invention. It is seen that when the voltage applied to the second electrode 20 goes more negative that is, when the reverse bias applied across the heterojunction between the n type semiconductor layer 18 and the photoconductive layer 19 is increased, the photosensitivity is increased. Therefore, when the output signal is converted into a DC voltage which is applied as a decreasing reverse bias voltage across the heterojunction to the second electrode 20, there may be provided a negative feedback circuit in which, when the output signal increases the voltage applied to the second electrode is increased, the output signal may be decreased. In a negative feedback circuit as shown in FIG. 9, the input Ii is applied to the terminal 60. When the circuit constants or parameters are so selected that the relation $[A(1+\beta)=1]$ may be held, where A is the amplification factor of an amplifier 62 and $\beta$ is the ratio of the feedback amount of a negative feedback circuit 63, the circuit shown in FIG. 9 functions as an electrically automatic aperture control mechanism which may always maintain the output signal at a predetermined level.

Figure 10A:
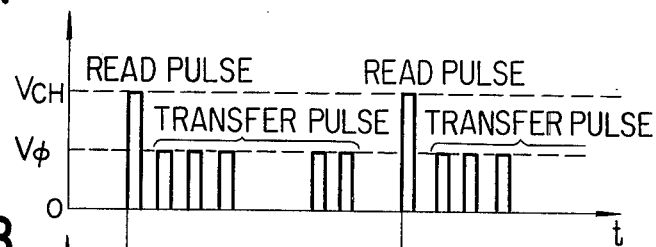
FIGS. 10A, 10B and 10C are views used for the explanation of the mode of controlling the storage or integration time.
Figure 10B:
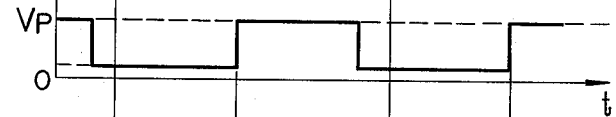
Figure 10C:
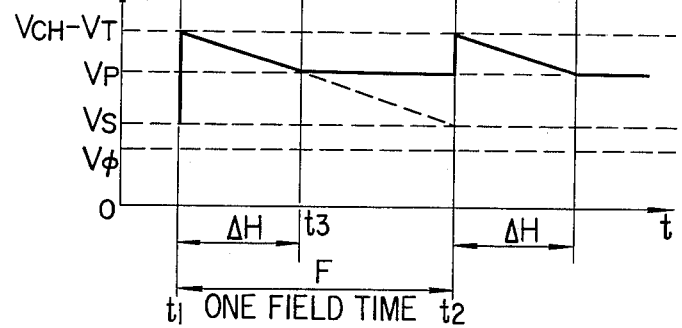

Thus far the DC voltage feedback system has been described. Next, the mode of operation as an automatic aperture control mechanism by the control of storage or integration time will be described with particular reference to FIG. 10A, FIG. 10B and FIG. 10C. FIG. 10A shows the driving pulses in the case of BBD operation (See also FIG. 2A), and FIG. 10B shows the waveform of the pulse applied to the second electrode 20. FIG. 10C shows the variations in voltage of the first electrode 17. When the read pulse is applied to the gate electrode 14 at $t_1$, the potential of the first electrode 17 rises to $(V_{CH}-V_T)$ and gradually drops to Vs depending upon the amount of incident light during one field time F. At $t_2$ when the next field starts, the potential rises again to $(V_{CH}-V_T)$. In this case, the storage or integration time is equal to F (1/60 sec). Meanwhile at $t_3$, the voltage applied to the second electrode 20 is raised as shown in FIG. 10B to the voltage Vp at which the sensitivity of the photoconductive layer drops considerably. As a result, from $t_3$ to $t_2$ the photo-carriers will not contribute to the sensitivity so that the real storage or integration time becomes $\Delta H$. It follows therefore that the photoelectric sensitivity may be freely varied by controlling the storage or integration time $\Delta H$. In order to apply this operation to an automatic aperture control mechanism, there may be provided a pulse generator which operates in response to the output signal from the terminal 39 (See FIG. 5) in such a way that the voltage Vp may be applied to the second electrode 20 at $t_3$.

Thus far the present invention has been described in detail in conjunction with the charge transfer type solid-state image pickup device, but it is to be understood that the present invention is not limited thereto. For instance, the present invention may be equally applied to an X-Y address type solid-state image pickup device in such a way that an automatic aperture control may be effected by applying to the second electrode 20 the DC or pulse voltage corresponding to the output voltage.

Thus far the description of the present invention has been centered on the feedback to the second electrode of the output signal from the solid image pickup device, but it is to be understood that the present invention is not limited to the output signal of the solid-state image pickup device. For instance, the same effect may be obtained by feeding back to the second electrode the output signal derived from a photodiode disposed adjacent to the solid-state image pickup plate.

What is claimed is:

1. A solid-state image pickup device characterized by the provision of
   (a) a semiconductor substrate having a first region of one conductive type and more than one second region of the other conductive type formed within the bulk of said semiconductor substrate,
   (b) a charge transfer type unit cell or an element capable of X-Y addressing formed within the bulk of said semiconductor substrate exterior of said second region of the other conductivity type,
   (c) a gate electrode for reading the signal charge stored in said second region of the other conductivity into said charge transfer type unit cell or said element capable of X-Y addressing,
   (d) an insulating layer formed over said semiconductor substrate and said gate electrode except a predetermined portion of said second region of the other conductivity type,
   (e) a first electrode selectively formed on said insulating layer and electrically connected to said second region of the other conductivity,
   (f) a photoconductive layer overlaying said first electrode and said insulating layer,
   (g) a second electrode formed over said photoconductive or photosensitive layer, and
   (h) a voltage application means for applying to said second electrode a voltage in proportion to the amount of incident light.

2. A solid-state image pickup device as set forth in claim 1 further characterized in that
   said voltage application means includes a means for controlling the charge integration or storage time in inverse proportion to the amount of incident light.

* * * * *